United States Patent
Lerner et al.

(10) Patent No.: US 10,536,148 B2
(45) Date of Patent: Jan. 14, 2020

(54) APPARATUS AND SYSTEM OF A LEVEL SHIFTER

(71) Applicant: TOWER SEMICONDUCTOR LTD., Migdal Haemek (IL)

(72) Inventors: Valentin Lerner, Petah Tikva (IL); Dan Pollak, Kadima (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 178 days.

(21) Appl. No.: 15/800,651

(22) Filed: Nov. 1, 2017

(65) Prior Publication Data

US 2019/0131971 A1   May 2, 2019

(51) Int. Cl.
*H03L 5/00*   (2006.01)
*H03K 19/0185*   (2006.01)

(52) U.S. Cl.
CPC ............... *H03K 19/018521* (2013.01)

(58) Field of Classification Search
CPC ............................................. H03K 19/018521
USPC .............................................. 327/333
See application file for complete search history.

(56) References Cited

U.S. PATENT DOCUMENTS

| 5,742,196 | A | 4/1998 | Fronen et al. |
| 7,205,819 | B2 | 4/2007 | Davis |
| 9,350,352 | B2 * | 5/2016 | Koike ............ H03K 19/01852 |
| 9,621,134 | B2 * | 4/2017 | Tian ................ H03K 3/356113 |
| 2019/0036532 | A1 * | 1/2019 | Kwon ................ H03K 3/356 |
| 2019/0158093 | A1 * | 5/2019 | Zhu .................. H03K 17/04123 |

* cited by examiner

*Primary Examiner* — Metasebia T Retebo
(74) *Attorney, Agent, or Firm* — Shichrur & Co.

(57) ABSTRACT

Some demonstrative embodiments include a level shifter to shift a high logic level and a low logic level of a Direct Current (DC) control signal of a first voltage domain to a high logic level and a low logic level of a second voltage domain, respectively.

22 Claims, 9 Drawing Sheets

APPARATUS AND SYSTEM OF A LEVEL SHIFTER

TECHNICAL FIELD

Embodiments described herein generally relate to a level shifter.

BACKGROUND

A Direct Current (DC) to DC converter may include a level shifter.

The level shifter may be configured to translate logic levels of a signal from a first voltage domain to a second voltage domain.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
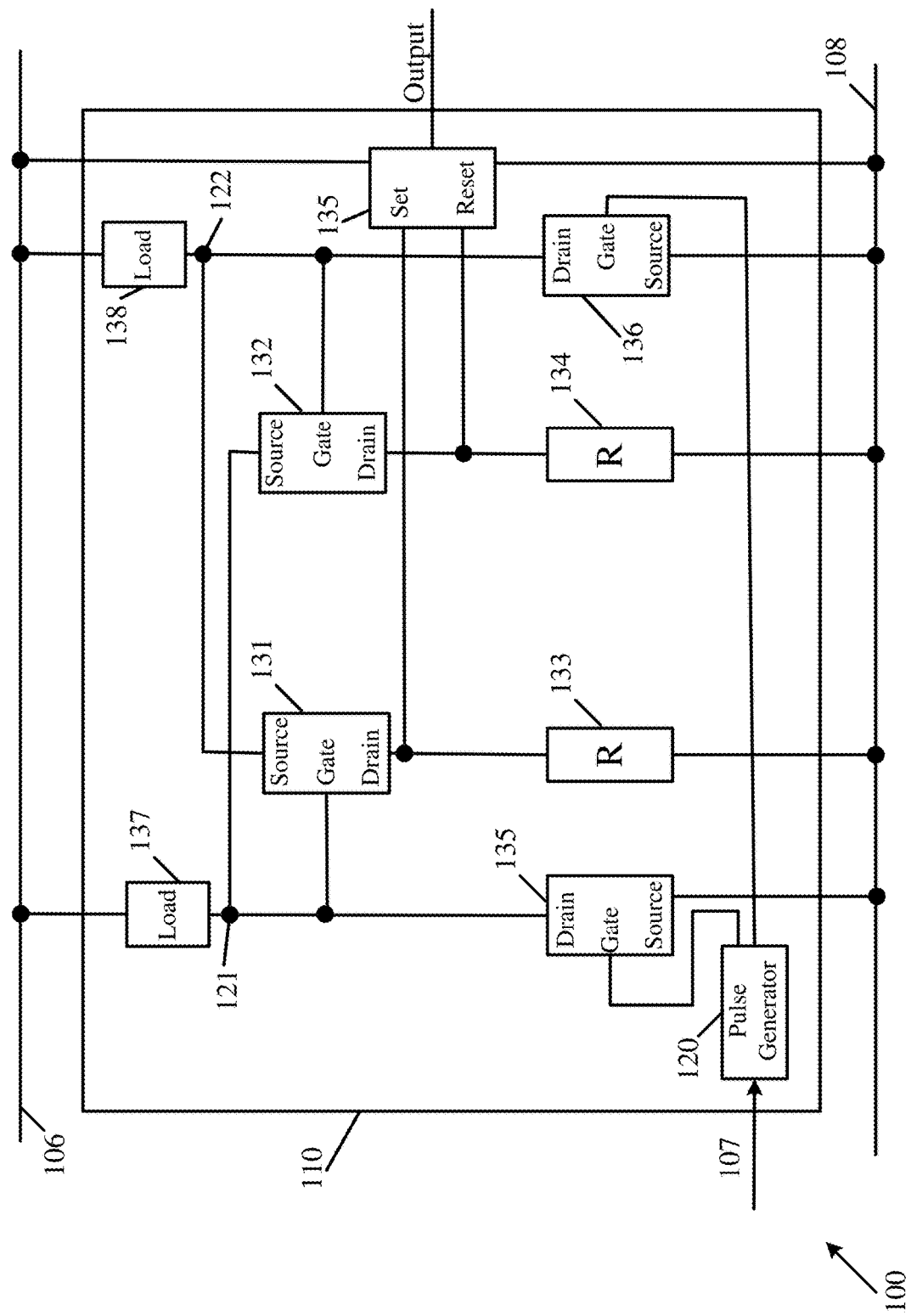
FIG. 1 is a schematic block diagram illustration of an apparatus, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an electronic device, a computing device, an integrated computing device, an integrated chip, electronic circuitry, a processing device, an electrical device, a processor, a memory device, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Integrated Circuit" (IC), as used herein, may relate to a set of one or more electronic circuits on a semiconductor material. For example, the electronic circuit may include electronic components and their interconnectors.

Reference is made to FIG. 1, which schematically illustrates a block diagram of an apparatus 100, in accordance with some demonstrative embodiments.

In some demonstrative embodiments, apparatus 100 may include an electronic circuit.

In some demonstrative embodiments, apparatus 100 may include an Integrated Circuit (IC).

In one example, the electronic circuit or the IC may include, may be part of, and/or may be implemented as part of, an electronic device.

In some demonstrative embodiments, apparatus 100 may include a level shifter 110.

In some demonstrative embodiments, level shifter 110 may be implemented as part of a Direct Current (DC) to DC (DC-DC) converter, e.g., as described below.

Figure 2:
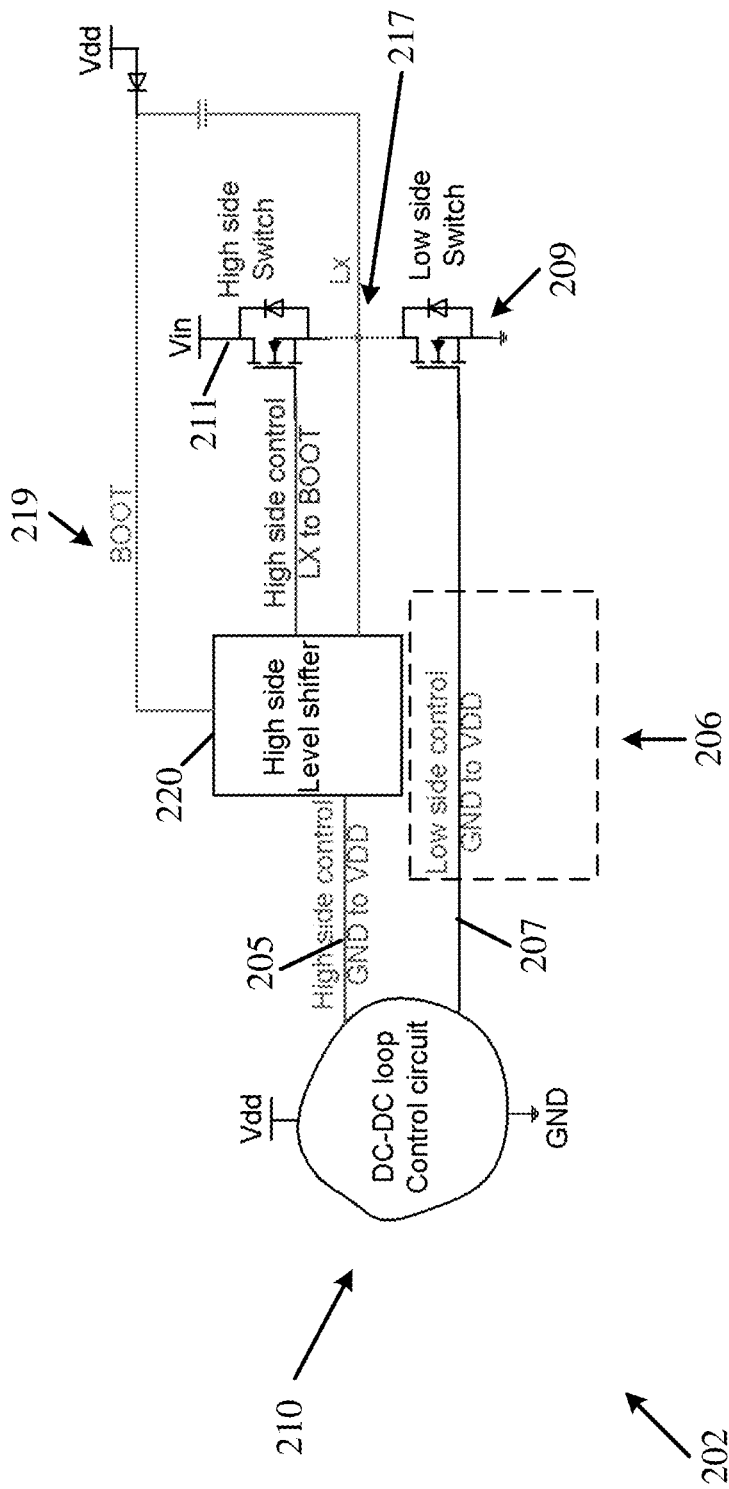
FIG. 2 is a schematic illustration of a Direct Current (DC) to DC (DC-DC) converter, in accordance with some demonstrative embodiments.

Reference is made to FIG. 2, which schematically illustrates a DC-DC converter 202, in accordance with some demonstrative embodiments.

In some demonstrative embodiments, DC-DC converter 202 may be configured to convert DC signals from a first voltage domain to a second voltage domain, e.g., as described below.

In some demonstrative embodiments, DC-DC converter 202 may be included, and/or may be implemented as part of, an electronic device, e.g., as described below with reference to FIG. 9.

In some demonstrative embodiments, DC-DC converter 202 may include electronic circuitry 210, e.g., as described below.

In some demonstrative embodiments, as shown in FIG. 2, electronic circuitry 210 may generate a high-side DC control signal 205.

In some demonstrative embodiments, as shown in FIG. 2, electronic circuitry 210 may generate a low-side DC control signal 207.

In some demonstrative embodiments, DC-DC converter 202 may be configured to convert voltage levels of high-side DC control signal 205 from a first voltage domain to a second voltage domain, e.g., as described below.

In one example, DC-DC converter 202 may be configured to convert logic levels of high-side DC control signal 205 to high-side voltage levels.

In some demonstrative embodiments, DC-DC converter 202 may be configured to convert voltage levels of low-side DC control signal 207 from a first voltage domain to a second voltage domain, e.g., as described below.

In one example, DC-DC converter 202 may be configured to convert high-side voltage levels of low-side DC control signal 207 to logic voltage levels.

In some demonstrative embodiments, as shown in FIG. 2, DC-DC converter 202 may include at least one level shifter, for example, to convert DC signals from a first voltage domain to a second voltage domain, e.g., as described below.

In some demonstrative embodiments, as shown in FIG. 2, DC-DC converter 202 may include a low-side level shifter 206, e.g., to convert the high-side voltage levels of low-side DC control signal 207 to the logic voltage levels.

In some demonstrative embodiments, as shown in FIG. 2, low-side level shifter 206 may translate low-side DC control signal 207 to a low-side switch 209.

In some demonstrative embodiments, as shown in FIG. 2, DC-DC converter 202 may include a high-side level shifter 220 to convert logic levels of the DC control signal 205 from the logic voltage levels to the high-side voltage levels, e.g., as described below.

In some demonstrative embodiments, level shifter 220 may be configured to shift a high logic level and a low logic level of the DC control signal 205 from the first voltage domain to a high logic level and a low logic level of the second voltage domain, respectively, e.g., as described below.

In some demonstrative embodiments, level shifter 220 may be configured, for example, to translate logic levels of DC control signal 205 from one voltage domain to another voltage domain. For examples, the high logic level of the first voltage domain may include a drain-drain voltage (VDD), and the low logic level of the first voltage domain may include a ground (GND). According to this example, the high logic level of the second voltage domain may include a BOOT voltage, and the low logic level of the second voltage domain may include an LX voltage. In another example, the high logic level and the low logic level of the second voltage domain may include any other voltages.

In one example, the BOOT and LX voltages may be between a switching node 217 of DC-DC converter, e.g., switching node "LX", and a boot-strapped voltage, e.g., "BOOT" voltage 219, e.g., a voltage which may be around "LX+VDD".

In some demonstrative embodiments, DC-DC converter 202 may be configured to translate control signal 205 to a switch 211, e.g., a high side switch, which may be activated through a voltage referenced to switching node 217.

In one example, translation of control signal 205 to switch 211 may be, for example, mandatory for a synchronous DC-DC converter, e.g., DC-DC converter 202.

Referring back to FIG. 1, in some demonstrative embodiments, level shifter 110 may be configured according to a scheme, which may allow, for example, to solve one or more technical problems, e.g., as described below.

Figure 3:
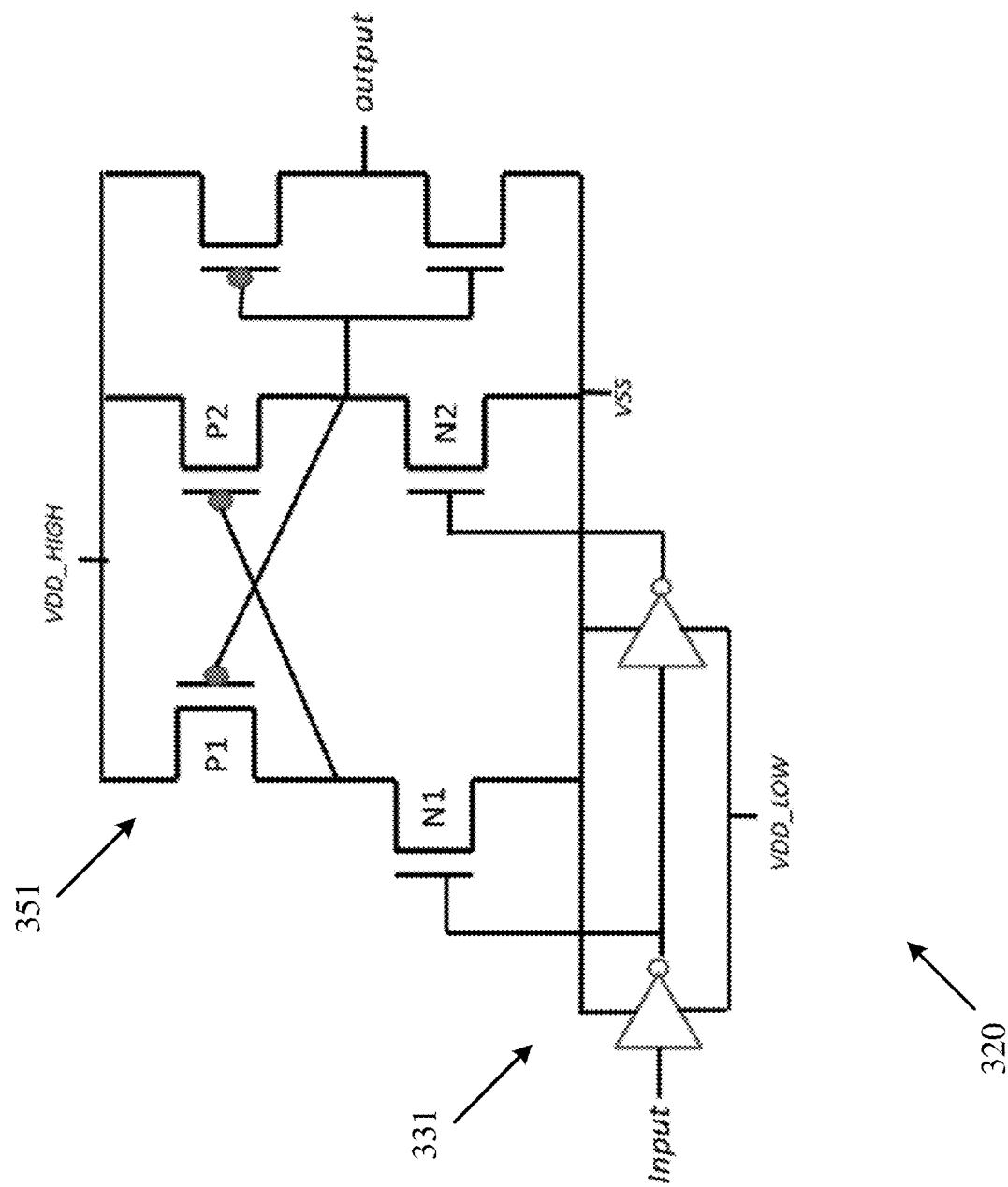
FIG. 3 is a schematic block diagram illustration of a level shifter to demonstrate one or more technical problems, which may be solved in accordance with some demonstrative embodiments.

Reference is made to FIG. 3, which schematically illustrates a level shifter 320 to demonstrate one or more technical problems, which may be solved in accordance with some demonstrative embodiments.

As shown in FIG. 3, level shifter 320 may include a first circuit 331 connected to a supply voltage of a first voltage domain, e.g., VDD LOW, and a second circuit 351 connected to a supply voltage of a high logic level of a second voltage domain, e.g., VDD HIGH, or to a changing supply rail, e.g., between an LX voltage and a BOOT voltage.

As shown in FIG. 3, both the low logic level of the first voltage domain and the low logic level of the second voltage domain may share the same ground or negative rail.

In one example, using another negative rail, e.g., instead of sharing the same ground or negative rail, may be implemented by using an opposite level shifter, e.g., having a common positive rail, in series with level shifter 320, for example, to shift the level shift to another positive and negative rail.

As shown in FIG. 3, ports of two respective transistors, denoted P1 and P2, of level shifter 320 may tolerate a maximum voltage between the negative and positive rail of level shifter 320, e.g., with or without the opposite level shifter, which may result in a voltage stress over the ports of the transistors P1 and P2.

A Set Reset (S/R) latch may be used, for example, to overcome the voltage stress over the ports of the transistors P1 and P2 of level shifter 320, e.g., as described below.

However, an architecture including an SR latch may have one or more technical problems, e.g., as described below.

Figure 4:
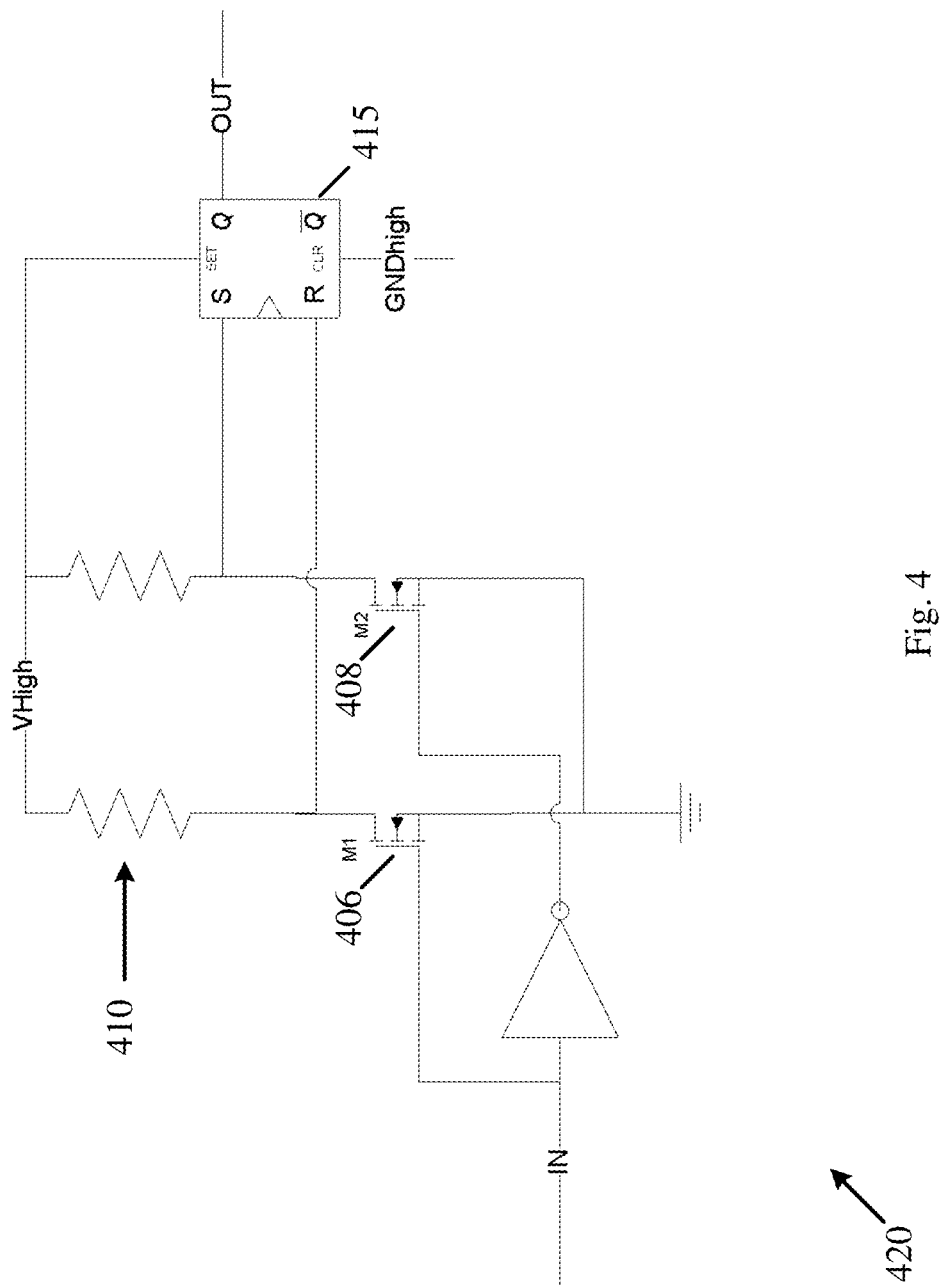
FIG. 4 is a schematic block diagram illustration of a level shifter to demonstrate one or more technical problems, which may be solved in accordance with some demonstrative embodiments.

Reference is made to FIG. 4, which schematically illustrates a level shifter 420 to demonstrate one or more technical problems, which may be solved, in accordance with some demonstrative embodiments.

As shown in FIG. 4, level shifter 420 may include an SR latch 415, which may be configured to tolerate a maximum voltage between the negative and positive rail of level shifter 420.

This configuration of level shifter 420 may have one or more disadvantages, e.g., as described below.

In one example, level shifter 420 may use a constant current to drive a first transistor 406 and a second transistor 408. The constant current may increase a power dissipation of level shifter 420.

In another example, a drain source voltage (VDS) of transistors 406 and/or 408 may be based on a difference between a high supply voltage (VHigh) and the low supply voltage (GND), e.g., VDS=VHigh-GND, which may be high in some applications, e.g., as high as 60V or even as high as 700V.

In another example, a voltage over resistors 410 may not be controlled, and/or the voltage over resistors 410 may exceed a voltage rating of SR latch 415.

A Zenner diode and/or any other clamping device may be used, for example, to overcome one or more disadvantages of level shifter 420, e.g., to overcome the voltage stress over resistors 410.

However, an architecture including a Zenner diode and/or any other clamping device may have one or more technical problems, e.g., as described below.

Figure 5:
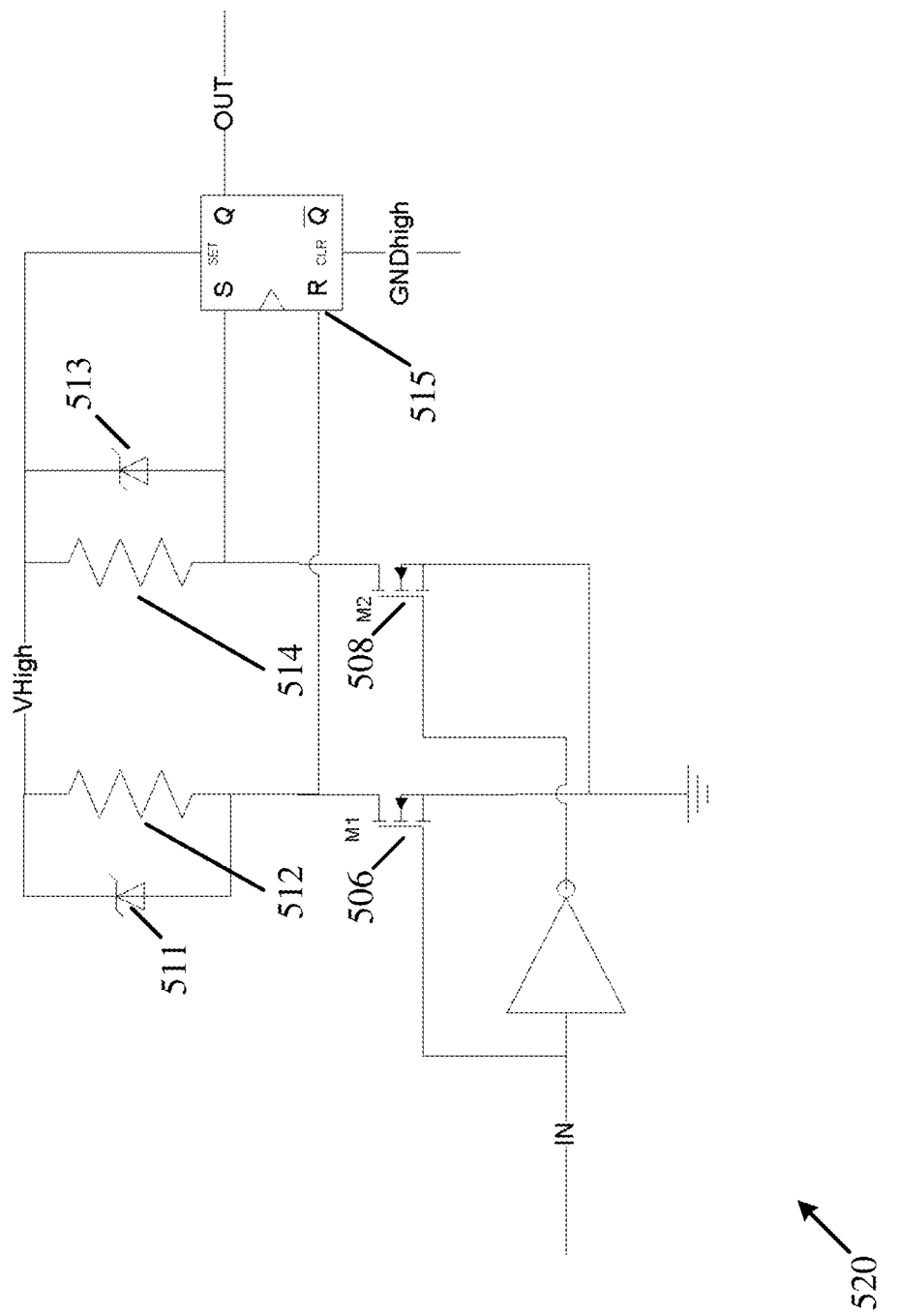
FIG. 5 is a schematic block diagram illustration of a level shifter to demonstrate one or more technical problems, which may be solved in accordance with some demonstrative embodiments.

Reference is made to FIG. 5, which schematically illustrates a level shifter 520 to demonstrate one or more technical problems, which may be solved, in accordance with some demonstrative embodiments.

As shown in FIG. 5, level shifter 520 may include an SR latch 515 configured to tolerate a maximum voltage between the negative and positive rail of level shifter 520.

As shown in FIG. 5, level shifter 520 may include a first Zenner diode 511 over a first resistor 512, for example, to limit a voltage over resistor 512.

As shown in FIG. 5, level shifter 520 may include a second Zenner diode 513 over a second resistor 514, for example, to limit a voltage over resistor 514.

This configuration of level shifter 520 may have one or more disadvantages, e.g., as described below.

For Example, level shifter 520 may use a constant current to drive a first transistor 506 and a second transistor 508. The constant current may increase a power dissipation of level shifter 520, e.g., as descried above with reference to FIG. 4.

A pulse generator (also referred to as a "one-shot") may be used, for example, to overcome one or more disadvantages of level shifter 520, e.g., to overcome the power dissipation of level shifter 520.

However, an architecture including a pulse generator may have one or more technical problems, e.g., as described below.

Figure 6:
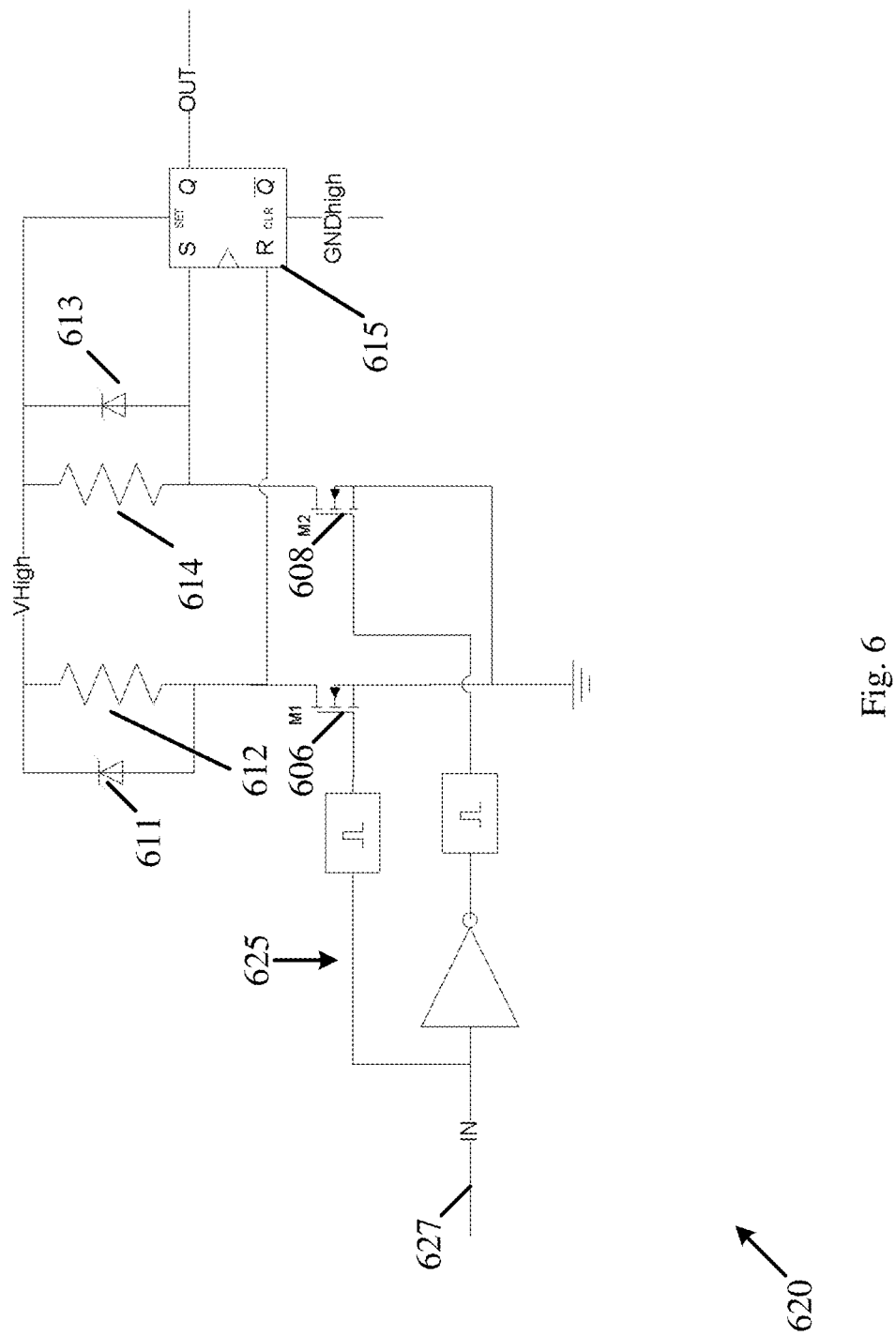
FIG. 6 is a schematic block diagram illustration of a level shifter to demonstrate one or more technical problems, which may be solved in accordance with some demonstrative embodiments.

Reference is made to FIG. 6, which schematically illustrates a level shifter 620 to demonstrate one or more technical problems, which may be solved, in accordance with some demonstrative embodiments.

As shown in FIG. 6, level shifter 620 may include an SR latch 615 configured to tolerate a maximum voltage between the negative and positive rail of level shifter 620.

As shown in FIG. 6, level shifter 620 may include a first Zenner diode 611 over a first resistor 612, for example, to limit a voltage over resistor 612.

As shown in FIG. 6, level shifter 620 may include a second Zenner diode 613 over a second resistor 614, for example, to limit a voltage over resistor 614.

As shown in FIG. 6, level shifter 620 may include a pulse generator 625 configured to drive a first transistor 606 and a second transistor 608, for example, by a pulse signal, e.g., instead of using a constant current to drive transistors 606 and/or 608.

In one example, transistors 606 and/or 608 may consume current, e.g., only during level transition of an input signal 627.

In another example, no current may be consumed, for example, when input signal 627 is not changing.

This configuration of level shifter 620 may have one or more technical deficiencies, e.g., as described below.

In one example, level shifter 620 may have a technical problem of a false triggering, e.g., during voltage transients of control signal 627, for example, because of a current created by charging/discharging drain capacitance in transistors 606 and/or 608.

In one example, during an operational phase of level shifter 620 both SET and RESET nodes, e.g., transistors 606 and 608 respectively, may be asserted, for example, due to a parasitic capacitance to other nodes.

In another example, level shifter 620 may have the technical problem of the false triggering, for example, due to switching nature of an LX node.

In some demonstrative embodiments, there may be a technical problem to eliminate the false triggering of level shifter 620, e.g., as described below.

In one example, keeping a close match and differential layout between both sides of level shifter 620 may be complicated, hard to establish, and/or may complicate a manufacturing process of level shifter 620.

In another example, adding hysteresis on inputs of SR latch 625, e.g., by implementing a positive feedback from an output of level shifter 620, may add additional circuitry, which may be complicated, and/or may complicate a manufacturing process of level shifter 620.

In another example, filtering SR inputs of SR latch 625, may add a delay, e.g., a built-in delay, to a switching time of level shifter 620.

In another example, adding boosting circuitry to decrease propagation delay may add additional circuitry to level shifter 620.

In another example, using an asymmetrical structure may be susceptible to high voltage supply switching, e.g., due to a parasitic capacitance, and/or may have a limited capability with respect to a voltage level of the high supply voltage VDD, e.g., limited by a gate-source voltage.

In another example, constantly applying a signal defining a present state, or setting a control logic, may consume a constant current, and/or may include special topologies, which may be complicated.

Referring back to FIG. 1, in some demonstrative embodiments, level shifter 110 may be configured to mitigate or eliminate the false triggering problem, e.g., as described below.

In some demonstrative embodiments, level shifter 110 may be configured to operate, for example, even without requiring a constant DC current, e.g., as described below.

In some demonstrative embodiments, level shifter 110 may eliminate a possibility of false triggering, for example, by preventing an output stage change state, e.g., when "SET" and "RESET" nodes affected by switching phase, and/or by preventing parasitic capacitance on both "SET" and "RESET" nodes, e.g., as described below.

In some demonstrative embodiments, level shifter 110 may be configured to address the problem of false triggering, for example, even without keeping a close match and differential layout between both sides of level shifter 110, e.g., as described below.

In some demonstrative embodiments, level shifter 110 may be configured to address the problem of false triggering, for example, even without adding additional circuitry, and/or a positive feedback circuitry, e.g., as described below.

In some demonstrative embodiments, level shifter 110 may be configured to address the problem of false triggering, for example, even without a boosting circuitry, for example, to decrease a propagation delay, e.g., as described below.

In some demonstrative embodiments, level shifter 110 may be configured to operate, for example, even without requiring any type of boosting circuitry to decrease propagation delay, for example, since a charge/discharge phase may be limited only by a sizing of shifting transistors, and may not be limited by a maximal current which may flow through level shifter 110, e.g., as described below.

In some demonstrative embodiments, level shifter 110 may be configured to address the problem of false triggering, for example, even without adding any delay to the switching time of level shifter 110, e.g., as described below.

In some demonstrative embodiments, level shifter 110 may implement a symmetrical structure, which may provide an immunity to an asymmetrical behavior during switching times, e.g., as described below.

In some demonstrative embodiments, level shifter 110 may be configured to handle high voltage levels, for example, which may not be limited by a gate-source voltage, e.g., as described below.

In some demonstrative embodiments, level shifter 110 may be configured to enable a fast mechanism of state change, for example, since level shifter 110 may not be limited by a maximal current flow between a low side circuitry and a high side circuitry of level shifter 110, e.g., as described below.

In some demonstrative embodiments, level shifter 110 may be configured to shift a high logic level and a low logic level of a Direct Current (DC) control signal 107 of a first voltage domain to a high logic level and a low logic level of a second voltage domain, respectively, e.g., as described below.

In some demonstrative embodiments, level shifter 110 may be configured to shift from logic voltage levels to high-side voltage levels, e.g., as described below.

In some demonstrative embodiments, level shifter 110 may include a high-side level shifter, e.g., as described below.

In some demonstrative embodiments, the high logic level of the first voltage domain may include a VDD, and/or the low logic level of the first voltage domain may include a ground (GND), e.g., as described below.

In some demonstrative embodiments, the high logic level of the second voltage domain may include a BOOT voltage, and/or the low logic level of the second voltage domain may include an LX voltage, e.g., as described below.

In other embodiments, level shifter 110 may be configured to shift from the high-side voltage levels to the logic voltage levels, e.g., as described below. For example, level shifter 110 may include a low-side level shifter, e.g., as described below.

In some demonstrative embodiments, level shifter 110 may include a pulse generator 120 configured to generate a set pulse signal, for example, when the DC control signal 107 shifts from the low logic level of the first voltage domain to the high logic level of the first voltage domain, e.g., as described below. For example, pulse generator 120 may generate the set pulse signal, for example, when the DC control signal 107 shifts from "0" to "1", e.g., as described below.

In some demonstrative embodiments, the set pulse signal may be configured to create a first voltage drop between a first node 121 and a second node 122, e.g., as described below.

In some demonstrative embodiments, pulse generator 120 may be configured to generate a reset pulse signal, for example, when the DC control signal 107 shifts from the high logic level of the first voltage domain to the low logic level of the first voltage domain, e.g., as described below.

For example, pulse generator 120 may generate the reset pulse signal, for example, when the DC control signal 107 shifts from "1" to "0", e.g., as described below.

In some demonstrative embodiments, the reset pulse signal may be configured to create a second voltage drop between first node 121 and second node 122, e.g., as described below.

In some demonstrative embodiments, level shifter 110 may include a first control transistor 131 configured to trigger a set voltage, for example, based on the first voltage drop between first node 121 and second node 122, e.g., as described below.

In some demonstrative embodiments, a gate of the first control transistor 131 may be coupled to the first node 121, e.g., as described below.

In some demonstrative embodiments, level shifter 110 may include a second control transistor 132 configured to trigger a reset voltage, for example, based on the second voltage drop between first node 121 and second node 122, e.g., as described below.

In some demonstrative embodiments, a gate of the second control transistor 132 may be coupled to the second node 122, e.g., as described below.

In some demonstrative embodiments, control transistor 131 and/or control transistor 132 may include a P-channel transistor.

In one example, control transistor 131 and/or control transistor 132 may include a P-channel metal-oxide-semiconductor (PMOS) transistor In another example, control transistor 131 and/or control transistor 132 may include any other P-channel transistor.

In another example, control transistor 131 and/or control transistor 132 may include any other transistor.

In some demonstrative embodiments, level shifter 110 may include an SR latch 135 coupled between a first supply voltage 106 and a second supply voltage 108 corresponding to the second voltage domain. For example, SR latch 135 may be coupled between a VBOOT voltage and an LX voltage, e.g., as described below.

In some demonstrative embodiments, the first control transistor 131 may include a drain coupled to a set input, denoted "Set", of the SR latch 135, e.g., as described below.

In some demonstrative embodiments, the first control transistor 131 may include a source coupled to the second node 122, e.g., as described below.

In some demonstrative embodiments, the second control transistor 132 may include a drain coupled to a reset input, denoted "Reset", of the SR latch 135, e.g., as described below.

In some demonstrative embodiments, the second control transistor 132 may include a source coupled to the first node 121, e.g., as described below.

In some demonstrative embodiments, SR latch 135 may be configured to output the high logic level of the second voltage domain, for example, based on the set voltage. For example, SR latch 135 may output VBOOT based on the set voltage, e.g., as described below.

In some demonstrative embodiments, SR latch 135 may be configured to output the high logic level of the second voltage domain, for example, when the set voltage is at the set input of SR latch 135, e.g., as described below.

In some demonstrative embodiments, SR latch 135 may be configured to output the low logic level of the second voltage domain, for example, based on the reset voltage. For example, SR latch 135 may output LX voltage, for example, based on the reset voltage, e.g., as described below.

In some demonstrative embodiments, SR latch 135 may be configured to output the low logic level of the second voltage domain, for example, when the reset voltage is at the reset input of the SR latch 135, e.g., as described below.

In some demonstrative embodiments, the first voltage drop between first node 121 and second node 122 may be configured to open the gate of the first control transistor 131, and/or to close the gate of the second control transistor 132.

In some demonstrative embodiments, the second voltage drop between first node 121 and second node 122 may be configured to close the gate of the first control transistor 131, and/or to open the gate of the second control transistor 132, e.g., as described below.

In some demonstrative embodiments, a value of the first voltage drop may be opposite to a value of the second voltage drop, e.g., as described below.

In some demonstrative embodiments, an absolute value of the first voltage drop may be greater than a threshold voltage of the first control transistor 131, e.g., as described below.

In some demonstrative embodiments, an absolute value of the second voltage drop may be greater than a threshold voltage of the second control transistor 132.

In some demonstrative embodiments, level shifter 110 may include a first shifting transistor 135 configured to create the first voltage drop, for example, based on the set pulse signal, e.g., from pulse generator 120, e.g., as described below.

In one example, first shifting transistor 135 may create the first voltage drop, for example, when the set pulse signal is applied at a gate of first shifting transistor 135, e.g., as described below.

In some demonstrative embodiments, level shifter 110 may include a second shifting transistor 136 configured to create the second voltage drop, for example, based on the reset pulse signal, e.g., from pulse generator 120, e.g., as described below.

In one example, second shifting transistor 136 may create the second voltage drop, for example, when the reset pulse signal is applied at a gate of second shifting transistor 136, e.g., as described below.

In some demonstrative embodiments, the first shifting transistor 135 and/or the second shifting transistor 136 may include an N-channel transistor.

In one example, the first shifting transistor 135 and/or the second shifting transistor 136 may include an N-channel metal-oxide-semiconductor (NMOS) transistor.

In another example, the first shifting transistor 135 and/or the second shifting transistor 136 may include any other N-channel transistor.

In other embodiments, shifting transistors 135 and/or 136 may include any other type of transistors.

In some demonstrative embodiments, a drain of the first shifting transistor 135 may be coupled to the first node 121, e.g., as described below.

In some demonstrative embodiments, a drain of the second shifting transistor 136 may be coupled to the second node 122, e.g., as described below.

In some demonstrative embodiments, level shifter 110 may include a first load resistor 137 and a second load resistor 138, e.g., as described below.

In some demonstrative embodiments, the first load resistor 137 and the second load resistor 138 may be coupled to the first supply voltage 106 corresponding to the second voltage domain. For example, the first load resistor 137 and the second load resistor 138 may be coupled to the BOOT voltage, e.g., as described below.

In some demonstrative embodiments, the first load resistor 137 may be coupled to the first node 121, e.g., as described below.

In some demonstrative embodiments, the second load resistor 138 may be coupled to the second node 122, e.g., as described below.

In some demonstrative embodiments, the first voltage drop may include a first voltage drop between the first load resistor 137 and the second load resistor 138, e.g., as described below.

In some demonstrative embodiments, the second voltage drop may include a second voltage drop between the first load resistor 137 and the second load resistor 138, e.g., as described below.

In some demonstrative embodiments, a resistance of the first load resistor 137 may be equal to a resistance of the second load resistor 138.

In some demonstrative embodiments, level shifter 110 may include a first resistor 133 and a second resistor 134, e.g., as described below.

In some demonstrative embodiments, the first resistor 133 and the second resistor 134 may be coupled to the second supply voltage 108 corresponding to the second voltage domain. For example, the first resistor 133 and the second resistor 134 may be coupled to the LX supply voltage, e.g., as described below.

In some demonstrative embodiments, the first resistor 133 may be coupled to the drain of the first control transistor 131 and to the set input of the SR latch 135, e.g., as described below.

In some demonstrative embodiments, the second resistor 134 may be coupled to the drain of the second control transistor 132 and to the reset input of the SR latch 135, e.g., as described below.

In some demonstrative embodiments, the set voltage may be across the first resistor 133. In one example, SR latch 135 may output the high logic level of the second voltage domain, e.g., the BOOT voltage, for example, when the set voltage is across the first resistor 133, e.g., as described below.

In some demonstrative embodiments, the reset voltage may be across the second resistor 134. In one example, SR latch 135 may output the low logic level of the second voltage domain, e.g., the LX voltage, for example, when the reset voltage is across the second resistor 134, e.g., as described below.

Figure 7:
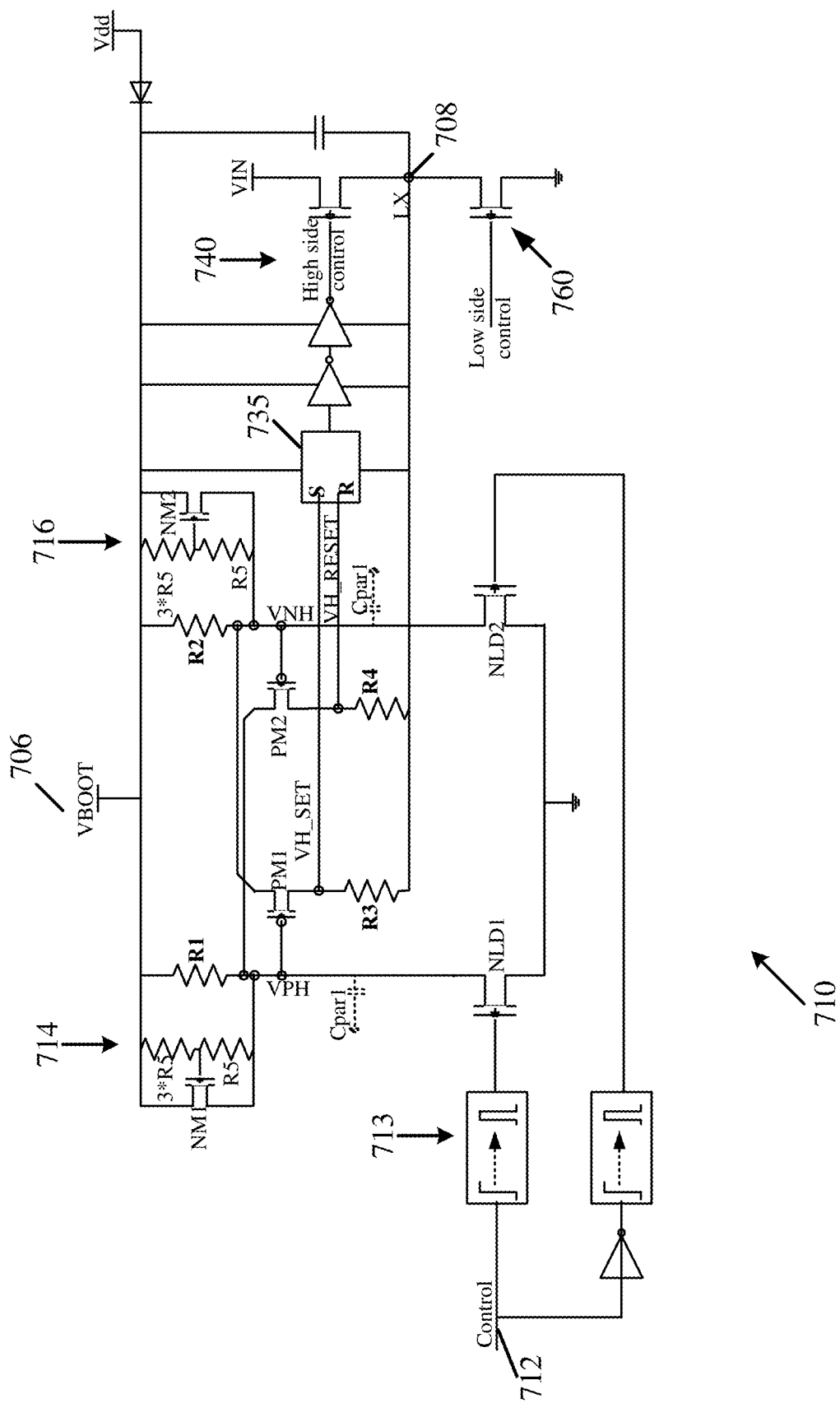
FIG. 7 is a schematic block diagram illustration of a level shifter, in accordance with some demonstrative embodiments.

Reference is made to FIG. 7, which schematically illustrates a level shifter 710, in accordance with some demonstrative embodiments.

In one example, level shifter 110 (FIG. 1) may perform one or more operations of, the functionality of, and/or the role of level shifter 710.

In some demonstrative embodiments, level shifter 710 may include a high-side level shifter, e.g., as described below.

In some demonstrative embodiments, level shifter 710 may be configured to shift from low-side voltage levels e.g., logic voltage levels, to high-side voltage levels, e.g., as described below.

In some demonstrative embodiments, a high logic level of the logic voltage levels may include a VDD, and a low logic level of the logic voltage levels may include a ground (GND), e.g., as described below.

In some demonstrative embodiments, the high logic level of the high-side voltage levels may include a BOOT voltage, and the low logic level of the high-side voltage levels may include an LX voltage, e.g., as described below.

In some demonstrative embodiments, as shown in FIG. 7, level shifter 710 may be connected to a BOOT supply voltage (VBOOT) 706, and to an LX supply voltage 708.

In some demonstrative embodiments, as shown in FIG. 7, level shifter 710 may include two shifting transistors, denoted "NLD1" and "NLD2", e.g., two N-channel high voltage transistors, which may be inverted toward each other. For example, shifting transistors 133 and/or 134 (FIG. 1) may perform one or more operations of, the functionality of, and/or the role of, the two shifting transistors NLD1 and NLD2, respectively.

In some demonstrative embodiments, as shown in FIG. 7, the two shifting transistors NLD1 and NLD2 may be connected to a control input 712 via a pulse generator 713, e.g., a one shot generator.

In some demonstrative embodiments, as shown in FIG. 7, shifting transistor NLD1 may be connected to pulse generator 713, which may generate a SET pulse signal, e.g., for high side logic, for example, when control input 712 shifts from logic level "0" to logic level "1".

In some demonstrative embodiments, as shown in FIG. 7, when a gate of shifting transistor NLD1 is opened, e.g., based on the set pulse signal, a current will start to flow through shifting transistor NLD1.

In some demonstrative embodiments, as shown in FIG. 7, the current may generate a voltage drop over a first load resistor, denoted R1. In one example, the voltage drop may be equal to four times a threshold voltage (Vt) of a first N-channel transistor, denoted "NM1", e.g., 4*Vt of transistor NM1. In one example, the voltage drop over the first load resistor R1 may be based, for example, on a first clamping circuit 714 including the transistor NM1, three resistors, denoted "3*R5", and another resistor, denoted "R5".

In some demonstrative embodiments, as shown in FIG. 7, when the gate of shifting transistor NLD1 is opened, e.g., based on the set pulse signal, a current may not flow through shifting transistor NLD2, and therefore a voltage drop over a second load resistor, denoted R2, may be equal to zero.

In one example, load resistor 137 (FIG. 1) may perform one or more operations of, the functionality of, and/or the role of one or more of the first load resistor R1, the transistor NM1, the three resistors R5, and/or the resistor R5.

In some demonstrative embodiments, as shown in FIG. 7, level shifter 710 may include two control transistors, denoted "PM1" and "PM2", e.g., two P-channel transistors, which may be inverted toward each other. For example, control transistors 131 and/or 132 (FIG. 1) may perform one or more operations of, the functionality of, and/or the role of the two control transistors PM1 and PM2, respectively.

In some demonstrative embodiments, as shown in FIG. 7, opening the gate of shifting transistor NLD1 may create a voltage drop between a first node, denoted "VPH", and a second node, denoted "VNH".

In some demonstrative embodiments, as shown in FIG. 7, the voltage drop between the first node VPH and the second node VNH may include a difference between boot voltage (VBOOT), e.g., at the second node VNH, and VBOOT−4*Vtn, e.g., at the first node VPH.

In some demonstrative embodiments, as shown in FIG. 7, a gate of control transistor PM1 may be connected to the first node VPH and a source of control transistor PM1 may be connected to the second node VNH. Accordingly, the voltage drop between the first node VPH and the second node VNH may open the gate of control transistor PM1. For example, a gate source voltage (Vgs) of control transistor PM1 may include four times the threshold voltage Vt of the N-channel transistor NM1, e.g., Vgs=4*Vtn.

In some demonstrative embodiments, a voltage at a set node, denoted VH_SET, e.g., when the gate of control transistor PM1 is opened, may be determined, e.g., as follows:

$$VH\_SET=(VBOOT-LX)*R3/(R2+R3)+LX,$$

since $R3 \gg R2 \rightarrow VH\_SET=VBOOT.$ (1)

In some demonstrative embodiments, as shown in FIG. 7, when the gate of control transistor PM1 is opened, a gate of control transistor PM2 may be closed, for example, since a source voltage (Vs), of control transistor PM2, e.g., the voltage at the first node VPH, is lower than a gate voltage (Vg) of control transistor PM2, for example, the voltage at the second node VNH, e.g., Vs (=VPH)<Vg (=VNH).

In some demonstrative embodiments, as shown in FIG. 7, when control transistor PM2 is closed, voltage at a reset node, denoted "VH_RESET", may be equal to the LX voltage.

In some demonstrative embodiments, as shown in FIG. 7, level shifter 710 may include an SR latch 735 connected between the boot voltage 706 and the LX voltage 708. For example, SR latch 135 (FIG. 1) may perform one or more operations of, the functionality of, and/or the role of the SR latch 735.

In some demonstrative embodiments, SR latch 735 may receive a set signal, e.g., when the reset node VH_RESET is equal to the LX voltage, and the set node VH_SET is equal to the boot voltage, and may output a set state, which may open a gate of a high-side control switch 740.

In some demonstrative embodiments, as shown in FIG. 7, when the set pulse signal is over, the first shifting transistor NLD1 may be closed, the first node VPH may be charged through load resistor R1 to the VBOOT voltage, the first control transistor PM1 may be closed, and the set node VH_SET may be discharged to the LX supply voltage, e.g., via a resistor, denoted "R3".

In some demonstrative embodiments, as shown in FIG. 7, when the set pulse signal is over, there may be no current flow through level shifter 710. However, SR latch 735 may maintain the "SET" state, and, therefore, the gate of the high-side control switch 740 may remain opened.

In some demonstrative embodiments, as shown in FIG. 7, level shifter 710 may have a symmetrical architecture, e.g., as described below.

In some demonstrative embodiments, level shifter may have a similar behavior, when pulse generator 713 generates a reset pulse signal, e.g., as described below.

In some demonstrative embodiments, as shown in FIG. 7, pulse generator 713 may generate the RESET pulse signal, e.g., for low-side logic, for example, when control input 712 shifts from logic level "1" to logic level "0".

In some demonstrative embodiments, as shown in FIG. 7, shifting transistor NLD2 may be connected to pulse generator 713, via an inverted signal, which may generate a RESET pulse signal, for example, when control input 712 goes from logic level "1" to logic level "0".

In some demonstrative embodiments, as shown in FIG. 7, when a gate of shifting transistor NLD2 is opened, e.g., based on the reset pulse signal, a current will start flow through shifting transistor NLD2.

In some demonstrative embodiments, as shown in FIG. 7, the current may generate a voltage drop over the second load resistor R2. In one example, the voltage drop may be equal to four times a threshold voltage (Vt) of a second N-channel transistor, denoted "NM2", e.g., 4*Vt of transistor NM2. In one example, the voltage drop over the second load resistor R2 may be based on a second clamping circuit 716 including the transistor NM2, three resistors, denoted "3*R5", and another resistor, denoted "R5".

In some demonstrative embodiments, as shown in FIG. 7, when the gate of shifting transistor NLD2 is opened, e.g., based on the reset pulse signal, a current may not flow through shifting transistor NLD1, therefore a voltage drop over the load resistor R1, may be equal to zero.

In one example, load resistor 138 (FIG. 1) may perform one or more operations of, the functionality of, and/or the role of one or more of the second load resistor R2, the transistor NM2, the three resistors R5, and/or the resistor R5.

In some demonstrative embodiments, as shown in FIG. 7, opening the gate of shifting transistor NLD2 may create a voltage drop between the first node VPH and the second node VNH.

In some demonstrative embodiments, the voltage drop between the first node VPH and the second node VNH may include a difference between boot voltage (VBOOT), e.g., at the first node VPH, and VBOOT−4*Vtn, e.g., at the second node VNH.

In some demonstrative embodiments, as shown in FIG. 7, a gate of control transistor PM2 may be connected to the second node VNH and a source of control transistor PM2 may be connected to the first node VPH. Accordingly, the voltage drop between the first node VPH and the second node VNH may open a gate of control transistor PM2. For example, a gate source voltage (Vgs) of control transistor PM2 may include four times the threshold voltage Vt of the N-channel transistor NM2, e.g., Vgs=4*Vtn.

In some demonstrative embodiments, a voltage at the reset node VH_RESET, e.g., when the gate of control transistor PM2 is opened, may be determined, e.g., as follows:

$$VH\_RESET=(VBOOT-LX)*R4/(R1+R4)+LX,$$

$$\text{since } R4>>R1 \rightarrow VH\_RESET=VBOOT. \quad (2)$$

In some demonstrative embodiments, as shown in FIG. 7, when the gate of control transistor PM2 is opened, a gate of control transistor PM1 may be closed, for example, since a source voltage (Vs), of control transistor PM1, e.g., the voltage at the second node VNH, is lower than a gate voltage (Vg) of control transistor PM1, e.g., the voltage at the first node VPH, for example, Vs (=VNH)<Vg (=VPH).

In some demonstrative embodiments, as shown in FIG. 7, when control transistor PM1 is closed, voltage at the set node VH_SET, may be equal to the LX voltage.

In some demonstrative embodiments, SR latch 735 may receive a reset signal, e.g., when the reset node VH_RESET is equal to the VBOOT voltage and the set node VH_SET is equal to the LX voltage, and may output a "reset" state, which may open a gate of a low-side control switch 760.

In some demonstrative embodiments, as shown in FIG. 7, when the reset pulse signal is over, the second shifting transistor NLD2 may be closed, the second node VNH may be charged through load resistor R2 to VBOOT, the second control transistor PM2 may be closed, and the reset node VH_RESET may be discharged to LX supply voltage 706, e.g., via a resistor R4.

In some demonstrative embodiments, as shown in FIG. 7, when the reset pulse signal is over there may be no current flow through level shifter 710. However, SR latch 735 may maintain the "RESET" state, and, therefore, the gate of the low-side control switch 760 may remain opened.

In some demonstrative embodiments, as shown in FIG. 7, when LX node is charged or discharged both the first node VPH and the second node VNH may have a same voltage, e.g., if a first charging parasitic capacitance, denoted Cpar1, over the first node VPH to boot voltage VBOOT, and a second charging parasitic capacitance, denoted Cpar2, over the second node VNH to boot voltage VBOOT, may be through equal resistors and may have a matched topology, e.g., as described below.

For example, the parasitic capacitance Cpar1 over the first node VPH to VBOOT through load resistor R1 may be equal to the parasitic capacitance Cpar2 over the second node VNH to VBOOT through load resistor R2, e.g., if load resistor R1 is equal to load resistor R2, and a topology of circuitry 714 is symmetric and equal to a topology of circuitry 716.

In some demonstrative embodiments, control transistors PM1 and PM2 may not be opened, for example, if the first node VPH and the second node VNH may have a same voltage.

In some demonstrative embodiments, a minimal requirement to open any one of control transistors PM1 and PM2 may be a voltage drop between the first node VPH and the second node VNH, which is greater than an absolute value of a threshold voltage of a respective control transistor of control transistors PM1 and PM2, e.g., |VPH−VNH|>Vtp. For example, the minimal requirement may increase immunity to false triggering.

In some demonstrative embodiments, the minimal requirement to open control transistor PM1 may include the voltage drop between the second node VNH and the first node VPH should be greater than the threshold voltage of control transistor PM1, e.g., VNH−VPH>Vtp.

In some demonstrative embodiments, the minimal requirement to open control transistor PM2 may include the voltage drop between the first node VPH and the second node VNH should be greater than the threshold voltage of control transistor PM2, e.g., VPH−VNH>Vtp.

Therefore, both control transistors PM1 and PM2 may remain closed, and/or SR latch 735 will preserve its state.

In some demonstrative embodiments, level shifter 710 may not require a constant DC current, and may eliminate possibility of false triggering, for example, by preventing output stage change state when both "SET" and "RESET" nodes affected by switching phase, and/or by preventing the parasitic capacitances Cpar1 and Cpar2 on nodes VPH and VNH, respectively, e.g., as described above.

Referring back to FIG. 1, in some demonstrative embodiments, level shifter 110 may include a low-side level shifter.

In some demonstrative embodiments, level shifter 110 may be configured to shift from the high-side voltage levels to the logic voltage levels, e.g., as described below.

In some demonstrative embodiments, the high logic level of the first voltage domain may include a BOOT voltage, and the low logic level of the first voltage domain may include an LX voltage, e.g., as described below.

In some demonstrative embodiments, the high logic level of the second voltage domain may include a VDD, and the low logic level of the first voltage domain may include a GND.

In some demonstrative embodiments, control transistor 131 and/or control transistor 132 may include a P-channel transistor, e.g., instead of N-channel transistor.

In one example, control transistor 131 and/or control transistor 132 may include a PMOS transistor.

In another example, control transistor 131 and/or control transistor 132 may include any other P-channel transistor.

In another example, control transistor 131 and/or control transistor 132 may include any other transistor.

In some demonstrative embodiments, the first shifting transistor 135 and/or the second shifting transistor 136 may include an N-channel transistor, e.g., instead of P-channel transistor.

In one example, the first shifting transistor 135 and/or the second shifting transistor 136 may include an NMOS transistor.

In another example, the first shifting transistor 135 and/or the second shifting transistor 136 may include any other N-channel transistor.

In another example, the first shifting transistor 135 and/or the second shifting transistor 136 may include any other transistor.

In some demonstrative embodiments, the first supply voltage 106 may include GND, and the second supply voltage 108 may include VDD, e.g., as described below.

Figure 8:
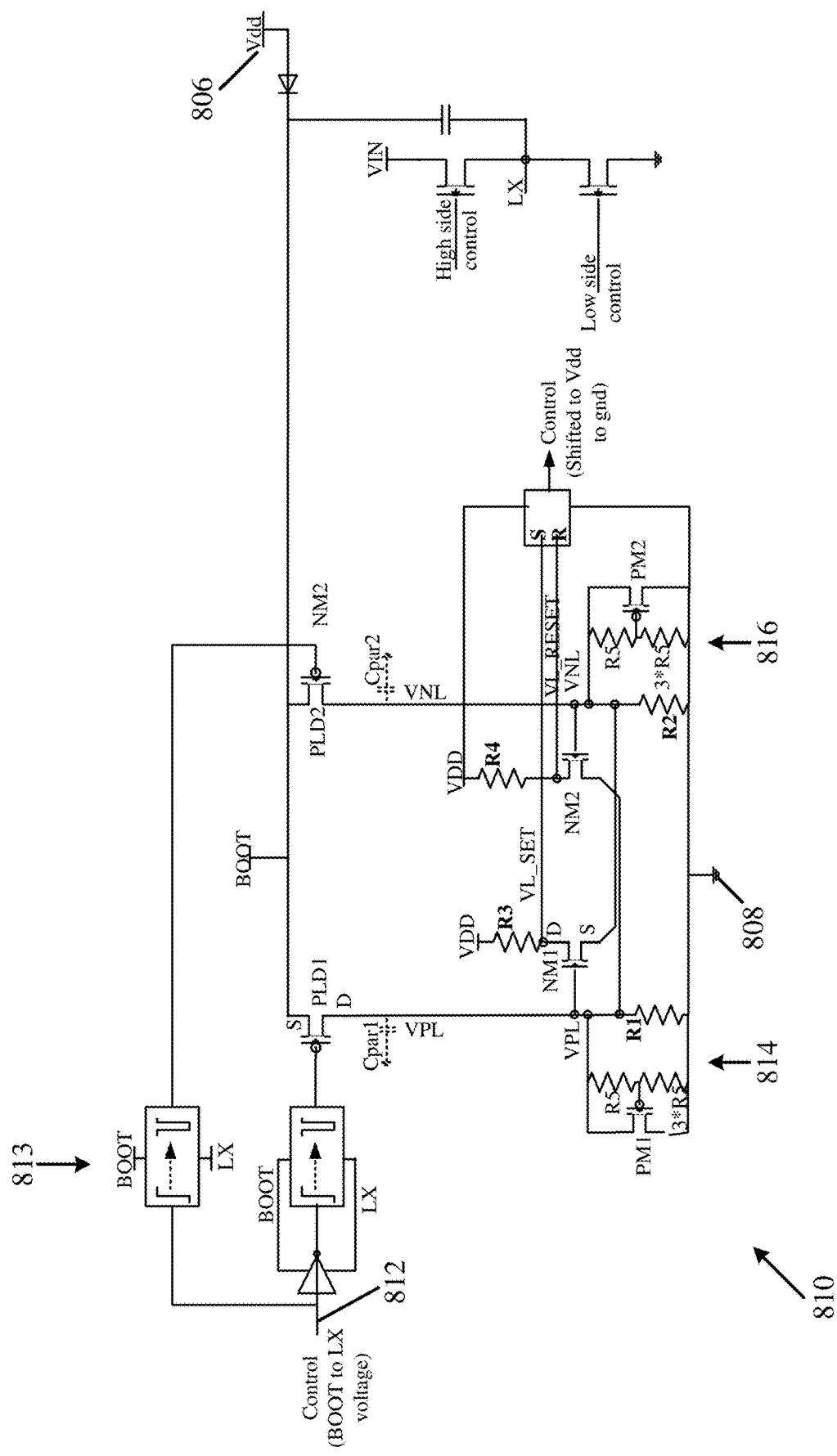
FIG. 8 is a schematic block diagram illustration of a level shifter, in accordance with some demonstrative embodiments.

Reference is made to FIG. 8, which schematically illustrates a level shifter 810, in accordance with some demonstrative embodiments.

In one example, level shifter 110 (FIG. 1) may perform one or more operations of, the functionality of, and/or the role of level shifter 810.

In some demonstrative embodiments, level shifter 810 may include a low-side level shifter, e.g., as described below.

In some demonstrative embodiments, level shifter 810 may be configured to shift from high-side voltage levels to logic voltage levels, e.g., as described below.

In some demonstrative embodiments, the high logic level of the logic voltage levels may include a VDD, and the low logic level of the logic voltage levels may include a ground (GND), e.g., as described below.

In some demonstrative embodiments, the high logic level of the high-side voltage levels may include a BOOT voltage, and the low logic level of the high-side voltage levels may include an LX voltage, e.g., as described below.

In some demonstrative embodiments, as shown in FIG. 8, level shifter 810 may be connected to a ground supply voltage (VBOOT) 808, and to a VDD supply voltage 806.

In some demonstrative embodiments, as shown in FIG. 8, level shifter 810 may include two shifting transistors, denoted "PLD1" and "PLD2", e.g., two P-channel transistors, which may be inverted toward each other. For example, shifting transistors 134 and/or 133 (FIG. 1) may perform one or more operations of, the functionality of, and/or the role of the two shifting transistors PLD1 and PLD2, respectively.

In some demonstrative embodiments, as shown in FIG. 8, the two shifting transistors PLD1 and PLD2 may be connected to a control input 812 via a pulse generator 813, e.g., a one shot generator.

In some demonstrative embodiments, as shown in FIG. 8, shifting transistor PLD1 may be connected to pulse generator 813, via an inverted signal, which may generate a RESET pulse signal, for example, when control input 812 goes from logic level "1" to logic level "0".

In some demonstrative embodiments, as shown in FIG. 8, when a gate of shifting transistor PLD1 is opened, e.g., based on the reset pulse signal, a current will start flow through shifting transistor PLD1.

In some demonstrative embodiments, as shown in FIG. 8, when the gate of shifting transistor PLD1 is opened, e.g., based on the reset pulse signal, a current may not flow through shifting transistor PLD2.

In some demonstrative embodiments, as shown in FIG. 8, level shifter 810 may include two control transistors, denoted "NM1" and "NM2", e.g., two N-channel transistors, which may be inverted toward each other. For example, control transistors 132 and/or 131 (FIG. 1) may perform one or more operations of, the functionality of, and/or the role of the two control transistors NM1 and NM2, respectively.

In some demonstrative embodiments, as shown in FIG. 8, opening the gate of shifting transistor PLD1 may create a voltage drop between a first node, denoted "VPL", and second node, denoted "VNL".

In some demonstrative embodiments, as shown in FIG. 8, the voltage drop between the first node VPL and the second node VNL may open a gate of control transistor NM1, e.g., since the gate of control transistor NM1 is connected to the first node VPL and a source of control transistor NM1 is connected to the second node VNL.

In some demonstrative embodiments, as shown in FIG. 8, when the gate of control transistor NM1 is opened, control transistor NM2 may be closed.

In some demonstrative embodiments, as shown in FIG. 8, when control transistor NM2 is closed, a reset node, denoted "VL_RESET", may be equal to the VDD voltage.

In some demonstrative embodiments, as shown in FIG. 8, level shifter 810 may include an SR latch 835 connected between the VDD and the GND. For example, SR latch 135 (FIG. 1) may perform one or more operations of, the functionality of, and/or the role of the SR latch 835.

In some demonstrative embodiments, as shown in FIG. 8, SR latch 835 may receive a reset signal, e.g., when the reset node VH_RESET is equal to the VDD voltage and the set node VH_SET is equal to the GND, and may output a reset state.

In some demonstrative embodiments, as shown in FIG. 8, when the reset pulse signal is over there may be no current flow through level shifter 810, however, SR latch 835 may maintain the "RESET" state, and, therefore, the gate of the high-side control switch 840 may remain opened.

In some demonstrative embodiments, as shown in FIG. 8, level shifter 810 may have a symmetrical architecture, e.g., as described below.

In some demonstrative embodiments, level shifter may have a similar behavior, when pulse generator 813 generate a set pulse signal, e.g., as described below.

In some demonstrative embodiments, as shown in FIG. 8, pulse generator 813 may generate the SET pulse signal, e.g., for low side logic, for example, when control input 812 shifts from logic level "0" to logic level "1".

In some demonstrative embodiments, as shown in FIG. 8, when a gate of shifting transistor PLD2 is opened, e.g., based on the set pulse signal, a current will start flow through shifting transistor PLD2.

In some demonstrative embodiments, as shown in FIG. 8, when the gate of shifting transistor PLD2 is opened, e.g., based on the set pulse signal, current may not flow through shifting transistor PLD1.

In some demonstrative embodiments, as shown in FIG. 8, opening the gate of shifting transistor PLD2 may create a voltage drop between the first node VPL and the second node VNL.

In some demonstrative embodiments, as shown in FIG. 8, when the gate of control transistor NM2 is opened, control transistor NM1 may be closed.

In some demonstrative embodiments, as shown in FIG. 8, when control transistor NM1 is closed, the set node VH_SET, may be equal to the VDD voltage.

In some demonstrative embodiments, as shown in FIG. 8, SR latch 835 may receive a set signal, e.g., when the set node VH_SET is equal to the VDD voltage and the set node VH_SET is equal to GND, and may output a set state.

In some demonstrative embodiments, as shown in FIG. 8, when the reset pulse signal is over there may be no current flow through level shifter 810, however, SR latch 835 may maintain the "SET" state, and, therefore, the gate of the low-side control switch 860 may remain opened.

In some demonstrative embodiments, as shown in FIG. 8, the first node VPL and the second node VNL may have a same voltage, e.g., if a first charging parasitic capacitance, denoted Cpar1, over the first node VPL, and a second charging parasitic capacitance, denoted Cpar2, over the second node VNL may be through equal resistors and may have a matched topology, e.g., as described below.

For example, a load resistor R1 may be equal to a load resistor R2 and topology of a circuitry 814 is symmetric and equal to a topology of a circuitry 816.

In some demonstrative embodiments, control transistors NM1 and NM2 may not be opened, for example, if the first node VPL and the second node VNL may have a same voltage.

In some demonstrative embodiments, a minimal requirement to open any one of control transistors NM1 and NM2 may be a voltage drop between the first node VPL and the second node VNL, which is greater than an absolute value of a threshold voltage of a respective control transistor of control transistors NM1 and NM2, e.g., |VPL−VNL|>Vtp. This requirement may, for example, increase immunity to false triggering.

In some demonstrative embodiments, the minimal requirement to open control transistor NM1 may include the voltage drop between the second node VNL and the first node VPL should be greater than the threshold voltage of control transistor NM1, e.g., VNL−VPL>Vtp.

In some demonstrative embodiments, the minimal requirement to open control transistor NM2 may include the voltage drop between the first node VPL and the second node VNL should be greater than the threshold voltage of control transistor NM2, e.g., VPL−VNL>Vtp.

Therefore, both control transistors NM1 and NM2 may remain close, and SR latch 835 latch will preserve its state.

In some demonstrative embodiments, level shifter 810 may not require a constant DC current, and may eliminate possibility of false triggering, for example, by preventing output stage change state when both "SET" and "RESET" nodes affected by switching phase, and/or by preventing the parasitic capacitance Cpar1 and Cpar2 on nodes VPL and VNL, respectively, e.g., as described above.

Figure 9:
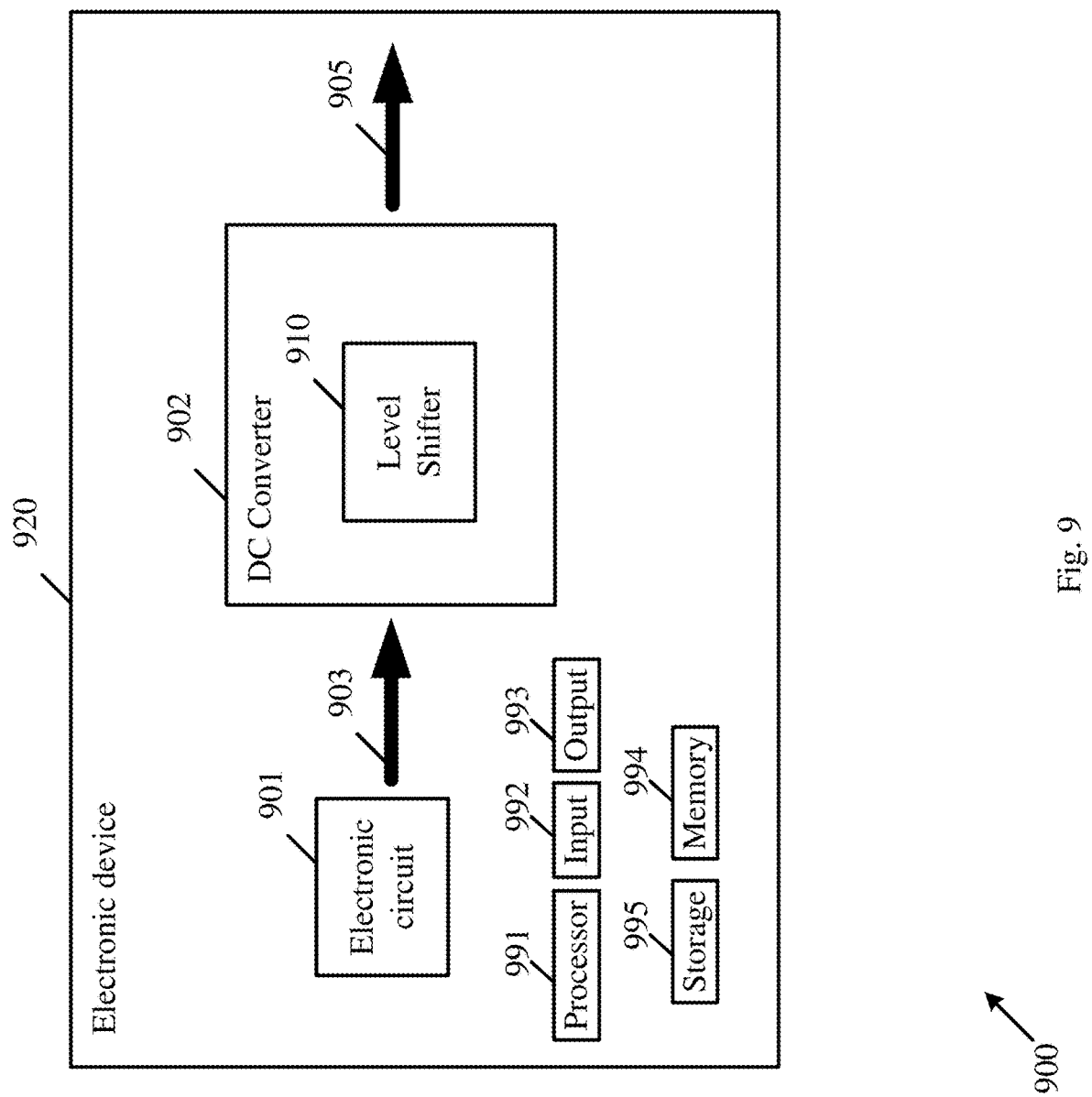
FIG. 9 is a schematic block diagram illustration of an electronic device, in accordance with some demonstrative embodiments.

Reference is made to FIG. 9, which schematically illustrates a block diagram of an electronic device 900, in accordance with some demonstrative embodiments.

In some demonstrative embodiments, electronic device 1000 may include, for example, a computing device, an electrical device, a mobile device, a mobile phone, a Smartphone, a mobile computer, a laptop computer, a notebook computer, a tablet computer, a handheld computer, an Internet of Things (IoT) device, a power charging device, a power supply device, a sensor device, a handheld device, a wearable device, a gaming device, digital camera, a media player, a music player, or the like.

In some demonstrative embodiments, electronic device 900 may include an electronic circuit 901 configured to perform one more functionalities of electronic device 900.

In some demonstrative embodiments, electronic circuit 901 may include an Integrated Circuit (IC) and/or any other circuitry.

In some demonstrative embodiments, electronic circuitry 901 may be configured to generate a DC control signal 903.

In some demonstrative embodiments, electronic device 900 may include a DC-DC converter 902 to convert logic levels of the DC control signal 903 from a first voltage domain to a second voltage domain. For example, DC-DC converter 902 may perform one or more operations of, the functionality of, and/or the role of DC-DC converter 202 (FIG. 2).

In some demonstrative embodiments, DC-DC converter 902 may include a level shifter 910 configured to shift a high logic level and a low logic level of the DC control signal 903 from the first voltage domain to an output 905 including a high logic level and a low logic level of the second voltage domain, respectively. For example, level shifter 910 may perform one or more operations of, the functionality of, and/or the role of level shifter 110 (FIG. 1), level shifter 710 (FIG. 7), and/or level shifter 810 (FIG. 1).

In some demonstrative embodiments, electronic device 900 may also include, for example, one or more of a processor 991, an input unit 992, an output unit 993, a memory unit 994, and/or a storage unit 995. Electronic device 900 may optionally include other suitable hardware components and/or software components. In some demonstrative embodiments, some or all of the components of one or more of electronic device 900 may be enclosed in a common housing or packaging, and may be interconnected or operably associated using one or more wired or wireless links.

In some demonstrative embodiments, processor 991 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 991 may execute instructions, for example, of an Operating System (OS) of electronic device 900 and/or of one or more suitable applications.

In some demonstrative embodiments, input unit 992 may include, for example, a keyboard, a keypad, a mouse, a touch-screen, a touch-pad, a track-ball, a stylus, a microphone, or other suitable pointing device or input device. Output unit 993 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 994 may includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 995 may include, for example, a hard disk drive, a floppy disk drive, a Compact Disk (CD) drive, a CD-ROM drive, a DVD drive, or other suitable removable or non-removable storage units. Memory unit 994 and/or storage unit 995, for example, may store data processed by electronic device 900.

EXAMPLES

The following examples pertain to further embodiments.

Example 1 includes a level shifter to shift a high logic level and a low logic level of a Direct Current (DC) control signal of a first voltage domain to a high logic level and a low logic level of a second voltage domain, respectively, the level shifter comprising a pulse generator configured to generate a set pulse signal when the DC control signal shifts from the low logic level of the first voltage domain to the high logic level of the first voltage domain, and to generate a reset pulse signal when the DC control signal shifts from the high logic level of the first voltage domain to the low logic level of the first voltage domain, the set pulse signal to create a first voltage drop between a first node and a second node, the reset pulse signal to create a second voltage drop between the first node and the second node; a first control transistor to trigger a set voltage based on the first voltage drop, a gate of the first control transistor is coupled to the first node; a second control transistor to trigger a reset voltage based on the second voltage drop, a gate of the second control transistor is coupled to the second node; and a set/reset (SR) latch coupled between a first supply voltage and a second supply voltage corresponding to the second voltage domain, the SR latch configured to output the high logic level of the second voltage domain based on the set voltage, and to output the low logic level of the second voltage domain based on the reset voltage.

Example 2 includes the subject matter of Example 1, and optionally, wherein the first control transistor comprises a drain coupled to a set input of the SR latch, and a source coupled to the second node, the second control transistor comprising a drain coupled to a reset input of the SR latch, and a source coupled to the first node.

Example 3 includes the subject matter of Example 1 or 2, and optionally, wherein the first voltage drop is configured to open the gate of the first control transistor and to close the gate of the second control transistor, the second voltage drop is configured to open the gate of the second control transistor and to close the gate of the first control transistor.

Example 4 includes the subject matter of any one of Examples 1-3, and optionally, wherein a value of the first voltage drop is opposite to a value of the second voltage drop.

Example 5 includes the subject matter of any one of Examples 1-4, and optionally, wherein an absolute value of the first voltage drop is greater than a threshold voltage of the first control transistor, and an absolute value of the second voltage drop is greater than a threshold voltage of the second control transistor.

Example 6 includes the subject matter of any one of Examples 1-5, and optionally, comprising a first shifting transistor configured to create the first voltage drop based on the set pulse signal, and a second shifting transistor configured to create the second voltage drop based on the reset pulse signal.

Example 7 includes the subject matter of Example 6, and optionally, wherein a drain of the first shifting transistor is coupled to the first node, and a drain of the second shifting transistor is coupled to the second node.

Example 8 includes the subject matter of Example 6 or 7, and optionally, wherein each of the first and second shifting transistors comprises an N-channel transistor.

Example 9 includes the subject matter of Example 6 or 7, and optionally, wherein each of the first and second shifting transistors comprises a P-channel transistor.

Example 10 includes the subject matter of any one of Examples 1-9, and optionally, comprising a first load resistor and a second load resistor coupled to the first supply voltage, the first load resistor coupled to the first node, the second load resistor coupled to the second node, the first voltage drop comprises a first voltage drop between the first and second load resistors, and the second voltage drop comprises a second voltage drop between the first and second load resistors.

Example 11 includes the subject matter of Example 10, and optionally, wherein a resistance of the first load resistor is equal to a resistance of the second load resistor.

Example 12 includes the subject matter of any one of Examples 1-11, and optionally, comprising a first resistor and a second resistor coupled to the second supply voltage corresponding to the second voltage domain, the set voltage is across the first resistor, and the reset voltage is across the second resistor.

Example 13 includes the subject matter of Example 12, and optionally, wherein the first resistor is coupled to a drain of the first control transistor and to a set input of the SR latch, the second resistor is coupled to a drain of the second control transistor and to a reset input of the SR latch.

Example 14 includes the subject matter of any one of Examples 1-13, and optionally, wherein the SR latch is configured to output the high logic level of the second voltage domain when the set voltage is at a set input of the SR latch, and to output the low logic level of the second voltage domain when the reset voltage is at a reset input of the SR latch.

Example 15 includes the subject matter of any one of Examples 1-14, and optionally, comprising a high-side level shifter.

Example 16 includes the subject matter of any one of Examples 1-15, and optionally, wherein the high logic level of the first voltage domain comprises a drain-drain voltage (VDD), the low logic level of the first voltage domain comprising a ground (GND), the high logic level of the second voltage domain comprises a BOOT voltage, and the low logic level of the second voltage domain comprising an LX voltage.

Example 17 includes the subject matter of any one of Examples 1-16, and optionally, wherein each of the first and second control transistors comprises a P-channel transistor.

Example 18 includes the subject matter of any one of Examples 1-14, and optionally, comprising a low-side level shifter.

Example 19 includes the subject matter of any one of Examples 1-14 or 18, and optionally, wherein the high logic level of the first voltage domain comprises a BOOT voltage, the low logic level of the first voltage domain comprising an LX voltage, the high logic level of the second voltage domain comprises a drain-drain voltage (VDD), and the low logic level of the first voltage domain comprising a ground (GND).

Example 20 includes the subject matter of any one of Examples 1-14 or 18-19, and optionally, wherein each of the first and second control transistors comprises an N-channel transistor.

Example 21 includes an electronic device comprising electronic circuitry to generate a Direct Current (DC) control signal; and a DC to DC (DC-DC) converter to convert logic levels of the DC control signal from a first voltage domain to a second voltage domain, the DC-DC converter comprising a level shifter to shift a high logic level and a low logic level of the DC control signal from the first voltage domain to a high logic level and a low logic level of the second voltage domain, respectively, the level shifter comprising a pulse generator configured to generate a set pulse signal when the DC control signal shifts from the low logic level of the first voltage domain to the high logic level of the first voltage domain, and to generate a reset pulse signal when the DC control signal shifts from the high logic level of the first voltage domain to the low logic level of the first voltage domain, the set pulse signal to create a first voltage drop between a first node and a second node, and the reset pulse signal to create a second voltage drop between the first node and the second node; a first control transistor to trigger a set voltage based on the first voltage drop, a gate of the first control transistor is coupled to the first node; a second control transistor to trigger a reset voltage based on the second voltage drop, a gate of the second control transistor is coupled to the second node; and a set/reset (SR) latch coupled between a first supply voltage and a second supply voltage corresponding to the second voltage domain, the SR latch configured to output the high logic level of the second voltage domain based on the set voltage, and to output the low logic level of the second voltage domain based on the reset voltage.

Example 22 includes the subject matter of Example 21, and optionally, wherein the first control transistor comprises a drain coupled to a set input of the SR latch, and a source coupled to the second node, the second control transistor comprising a drain coupled to a reset input of the SR latch, and a source coupled to the first node.

Example 23 includes the subject matter of Example 21 or 22, and optionally, wherein the first voltage drop is configured to open the gate of the first control transistor and to close the gate of the second control transistor, the second voltage drop is configured to open the gate of the second control transistor and to close the gate of the first control transistor.

Example 24 includes the subject matter of any one of Examples 21-23, and optionally, wherein a value of the first voltage drop is opposite to a value of the second voltage drop.

Example 25 includes the subject matter of any one of Examples 21-24, and optionally, wherein an absolute value of the first voltage drop is greater than a threshold voltage of the first control transistor, and an absolute value of the second voltage drop is greater than a threshold voltage of the second control transistor.

Example 26 includes the subject matter of any one of Examples 21-25, and optionally, wherein the level shifter comprises a first shifting transistor configured to create the first voltage drop based on the set pulse signal, and a second shifting transistor configured to create the second voltage drop based on the reset pulse signal.

Example 27 includes the subject matter of Example 26, and optionally, wherein a drain of the first shifting transistor is coupled to the first node, and a drain of the second shifting transistor is coupled to the second node.

Example 28 includes the subject matter of Example 26 or 27, and optionally, wherein each of the first and second shifting transistors comprises an N-channel transistor.

Example 29 includes the subject matter of Example 26 or 27, and optionally, wherein each of the first and second shifting transistors comprises a P-channel transistor.

Example 30 includes the subject matter of any one of Examples 21-29, and optionally, wherein the level shifter comprises a first load resistor and a second load resistor coupled to the first supply voltage, the first load resistor coupled to the first node, the second load resistor coupled to the second node, the first voltage drop comprises a first voltage drop between the first and second load resistors, and the second voltage drop comprises a second voltage drop between the first and second load resistors.

Example 31 includes the subject matter of Example 30, and optionally, wherein a resistance of the first load resistor is equal to a resistance of the second load resistor.

Example 32 includes the subject matter of any one of Examples 21-31, and optionally, wherein the level shifter comprises a first resistor and a second resistor coupled to the second supply voltage corresponding to the second voltage domain, the set voltage is across the first resistor, and the reset voltage is across the second resistor.

Example 33 includes the subject matter of Example 32, and optionally, wherein the first resistor is coupled to a drain of the first control transistor and to a set input of the SR latch, the second resistor is coupled to a drain of the second control transistor and to a reset input of the SR latch.

Example 34 includes the subject matter of any one of Examples 21-33, and optionally, wherein the SR latch is configured to output the high logic level of the second voltage domain when the set voltage is at a set input of the SR latch, and to output the low logic level of the second voltage domain when the reset voltage is at a reset input of the SR latch.

Example 35 includes the subject matter of any one of Examples 21-34, and optionally, wherein the level shifter comprises a high-side level shifter.

Example 36 includes the subject matter of any one of Examples 21-35, and optionally, wherein the high logic level of the first voltage domain comprises a drain-drain voltage (VDD), the low logic level of the first voltage domain comprising a ground (GND), the high logic level of the second voltage domain comprises a BOOT voltage, and the low logic level of the second voltage domain comprising an LX voltage.

Example 37 includes the subject matter of any one of Examples 21-36, and optionally, wherein each of the first and second control transistors comprises a P-channel transistor.

Example 38 includes the subject matter of any one of Examples 21-34, and optionally, wherein the level shifter comprises a low-side level shifter.

Example 39 includes the subject matter of any one of Examples 21-34 or 38, and optionally, wherein the high logic level of the first voltage domain comprises a BOOT voltage, the low logic level of the first voltage domain comprising an LX voltage, the high logic level of the second voltage domain comprises a drain-drain voltage (VDD), and the low logic level of the first voltage domain comprising a ground (GND).

Example 40 includes the subject matter of any one of Examples 21-34 or 38-39, and optionally, wherein each of the first and second control transistors comprises an N-channel transistor.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. A level shifter to shift a high logic level and a low logic level of a Direct Current (DC) control signal of a first voltage domain to a high logic level and a low logic level of a second voltage domain, respectively, the level shifter comprising:

a pulse generator configured to generate a set pulse signal when the DC control signal shifts from the low logic level of the first voltage domain to the high logic level of the first voltage domain, and to generate a reset pulse signal when the DC control signal shifts from the high logic level of the first voltage domain to the low logic level of the first voltage domain, the set pulse signal to create a first voltage drop between a first node and a second node, the reset pulse signal to create a second voltage drop between the first node and the second node;

a first shifting transistor configured to create the first voltage drop based on the set pulse signal, a drain of the first shifting transistor is connected to the first node;

a second shifting transistor configured to create the second voltage drop based on the reset pulse signal, a drain of the second shifting transistor is connected to the second node;

a first control transistor to trigger a set voltage based on the first voltage drop, a gate of the first control transistor is connected to the first node;

a second control transistor to trigger a reset voltage based on the second voltage drop, a gate of the second control transistor is connected to the second node; and a set/reset (SR) latch coupled between a first supply voltage and a second supply voltage corresponding to the second voltage domain, the SR latch configured to output the high logic level of the second voltage domain based on the set voltage, and to output the low logic level of the second voltage domain based on the reset voltage.

2. The level shifter of claim 1, wherein the first control transistor comprises a drain coupled to a set input of the SR latch, and a source coupled to the second node, the second control transistor comprising a drain coupled to a reset input of the SR latch, and a source coupled to the first node.

3. The level shifter of claim 1, wherein the first voltage drop is configured to open the gate of the first control transistor and to close the gate of the second control transistor, the second voltage drop is configured to open the gate of the second control transistor and to close the gate of the first control transistor.

4. The level shifter of claim 1, wherein a value of the first voltage drop is opposite to a value of the second voltage drop.

5. The level shifter of claim 1, wherein an absolute value of the first voltage drop is greater than a threshold voltage of the first control transistor, and an absolute value of the second voltage drop is greater than a threshold voltage of the second control transistor.

6. The level shifter of claim 1, wherein the first control transistor comprises a drain connected to a set input of the SR latch, and a source connected to the second node, wherein the second control transistor comprises a drain connected to a reset input of the SR latch, and a source connected to the first node, and wherein the first voltage drop is configured to open the gate of the first control transistor and to close the gate of the second control transistor, and the second voltage drop is configured to open the gate of the second control transistor and to close the gate of the first control transistor.

7. The level shifter of claim 1, wherein each of the first and second shifting transistors comprises an N-channel transistor.

8. The level shifter of claim 1 comprising a first load resistor and a second load resistor coupled to the first supply voltage, the first load resistor coupled to the first node, the second load resistor coupled to the second node, the first voltage drop comprises a first voltage drop between the first and second load resistors, and the second voltage drop comprises a second voltage drop between the first and second load resistors.

9. The level shifter of claim 8, wherein a resistance of the first load resistor is equal to a resistance of the second load resistor.

10. The level shifter of claim 1 comprising a first resistor and a second resistor coupled to the second supply voltage corresponding to the second voltage domain, the set voltage is across the first resistor, and the reset voltage is across the second resistor.

11. The level shifter of claim 10, wherein the first resistor is coupled to a drain of the first control transistor and to a set input of the SR latch, the second resistor is coupled to a drain of the second control transistor and to a reset input of the SR latch.

12. The level shifter of claim 1, wherein the SR latch is configured to output the high logic level of the second voltage domain when the set voltage is at a set input of the SR latch, and to output the low logic level of the second voltage domain when the reset voltage is at a reset input of the SR latch.

13. The level shifter of claim 1 comprising a high-side level shifter.

14. The level shifter of claim 1, wherein the high logic level of the first voltage domain comprises a drain-drain voltage (VDD), the low logic level of the first voltage domain comprising a ground (GND), the high logic level of the second voltage domain comprises a BOOT voltage, and the low logic level of the second voltage domain comprising an LX voltage.

15. The level shifter of claim 1, wherein each of the first and second control transistors comprises a P-channel transistor.

16. The level shifter of claim 1 comprising a low-side level shifter.

17. The level shifter of claim 1, wherein the high logic level of the first voltage domain comprises a BOOT voltage, the low logic level of the first voltage domain comprising an LX voltage, the high logic level of the second voltage domain comprises a drain-drain voltage (VDD), and the low logic level of the first voltage domain comprising a ground (GND).

18. The level shifter of claim 1, wherein each of the first and second control transistors comprises an N-channel transistor.

19. An electronic device comprising:
electronic circuitry to generate a Direct Current (DC) control signal; and
a DC to DC (DC-DC) converter to convert logic levels of the DC control signal from a first voltage domain to a second voltage domain, the DC-DC converter comprising:
a level shifter to shift a high logic level and a low logic level of the DC control signal from the first voltage domain to a high logic level and a low logic level of the second voltage domain, respectively, the level shifter comprising:
a pulse generator configured to generate a set pulse signal when the DC control signal shifts from the low logic level of the first voltage domain to the high logic level of the first voltage domain, and to generate a reset pulse signal when the DC control signal shifts from the high logic level of the first voltage domain to the low logic level of the first voltage domain, the set pulse signal to create a first voltage drop between a first node and a second node, and the reset pulse signal to create a second voltage drop between the first node and the second node;

a first control transistor to trigger a set voltage based on the first voltage drop, a gate of the first control transistor is connected to the first node;

a second control transistor to trigger a reset voltage based on the second voltage drop, a gate of the second control transistor is connected to the second node; and a set/reset (SR) latch coupled between a first supply voltage and a second supply voltage corresponding to the second voltage domain, the SR latch configured to output the high logic level of the second voltage domain based on the set voltage, and to output the low logic level of the second voltage domain based on the reset voltage, wherein the first control transistor comprises a drain connected to a set input of the SR latch, and a source connected to the second node, wherein the second control transistor comprises a drain connected to a reset input of the SR latch, and a source connected to the first node, and wherein the first voltage drop is configured to open the gate of the first control transistor and to close the gate of the second control transistor, and the second voltage drop is configured to open the gate of the second control transistor and to close the gate of the first control transistor.

20. The electronic device of claim 19, wherein the level shifter comprises:
a first load resistor and a second load resistor coupled to the first supply voltage corresponding to the second voltage domain, the first load resistor coupled to the first node the second load resistor coupled to the second node; and
a first resistor and a second resistor coupled to the second supply voltage corresponding to the second voltage domain, the set voltage is across the first resistor, and the reset voltage is across the second resistor.

21. The electronic device of claim 19, wherein the level shifter comprises a first shifting transistor configured to create the first voltage drop based on the set pulse signal, and a second shifting transistor configured to create the second voltage drop based on the reset pulse signal, a drain of the first shifting transistor is connected to the first node, and a drain of the second shifting transistor is connected to the second node.

22. The electronic device of claim 19, wherein the level shifter comprises a first load resistor and a second load resistor coupled to the first supply voltage, the first load resistor coupled to the first node, the second load resistor coupled to the second node, the first voltage drop comprises a first voltage drop between the first and second load resistors, and the second voltage drop comprises a second voltage drop between the first and second load resistors.

* * * * *